(12) United States Patent
Harle et al.

(10) Patent No.: US 7,663,155 B2
(45) Date of Patent: Feb. 16, 2010

(54) LUMINESCENT DIODE CHIP THAT IS FLIP-CHIP MOUNTED ON A CARRIER, AND METHOD FOR PRODUCTION THEREOF

(75) Inventors: Volker Harle, Laaber (DE); Dominik Eisert, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/184,239

(22) Filed: Jul. 18, 2005

(65) Prior Publication Data

US 2005/0248032 A1 Nov. 10, 2005

Related U.S. Application Data

(62) Division of application No. 10/401,825, filed on Mar. 28, 2003, now Pat. No. 6,927,425.

(30) Foreign Application Priority Data

Mar. 28, 2002 (DE) ................. 102 14 210

(51) Int. Cl.
*H01L 33/00* (2006.01)
(52) U.S. Cl. .............. 257/100; 257/99; 257/778; 257/779; 257/788
(58) Field of Classification Search .......... 257/100, 257/99, 778, 779, 788, 790
See application file for complete search history.

(56) References Cited

U.S. PATENT DOCUMENTS 5,345,092 A 9/1994 Kurihara
5,579,573 A 12/1996 Baker
5,930,642 A * 7/1999 Moore et al. ............ 438/407
6,268,230 B1 7/2001 Kuniyasu (Continued)

FOREIGN PATENT DOCUMENTS

DE 689 15 873 6/1994

(Continued)

OTHER PUBLICATIONS

Wlodzimierz Nakwasi, "Thermal Properties of the Burrus-Type Light-Emitting Diode: Part I-The Model", IEEE Transactions on Electron Devices, vol. Ed. 33 No. 7, Jul. 1986, pp. 889-907.

(Continued)

*Primary Examiner*—Long Pham
(74) *Attorney, Agent, or Firm*—Cohen Pontani Lieberman & Pavane LLP

(57) ABSTRACT

A luminescent diode chip for flip-chip mounting on a carrier, having a conductive substrate (12), a semiconductor body (14) that contains a photon-emitting active zone and that is joined by an underside to the substrate (12), and a contact (18), disposed on a top side of the semiconductor body (14), for making an electrically conductive connection with the carrier (30) upon the flip-chip mounting of the chip, whereby either the carrier is solder covered or a layer of solder is applied to the contact. An insulating means (40, 42, 44, 46, 48) is provided on the chip, for electrically insulating free faces of the semiconductor body (14) and free surfaces of the substrate (12) from the solder.

27 Claims, 5 Drawing Sheets

U.S. PATENT DOCUMENTS

| | | |
|---|---|---|
| 6,326,646 B1 | 12/2001 | Baillargeon et al. |
| 6,740,906 B2 | 5/2004 | Slater, Jr. et al. |
| 6,927,425 B2 * | 8/2005 | Harle et al. ................. 257/100 |

FOREIGN PATENT DOCUMENTS

| | | |
|---|---|---|
| EP | 0 351 092 B1 | 6/1994 |
| JP | 61222136 | 10/1986 |
| JP | 3023980 | 1/1991 |
| JP | 03-073471 | 7/1991 |
| JP | 08172238 | 7/1996 |
| JP | 11068153 | 3/1999 |
| JP | 11251360 | 9/1999 |

OTHER PUBLICATIONS

Shuji Nakamura, et al., "The Blue Laser Diode GaN Based Light Emitters and Lasers" published by Springer Verlag, Berlin and Heidelberg, 1997, pp. 7-12.

English translation of the Communication issued in a counterpart Japanese application and comments from Applicants' representative.

* cited by examiner

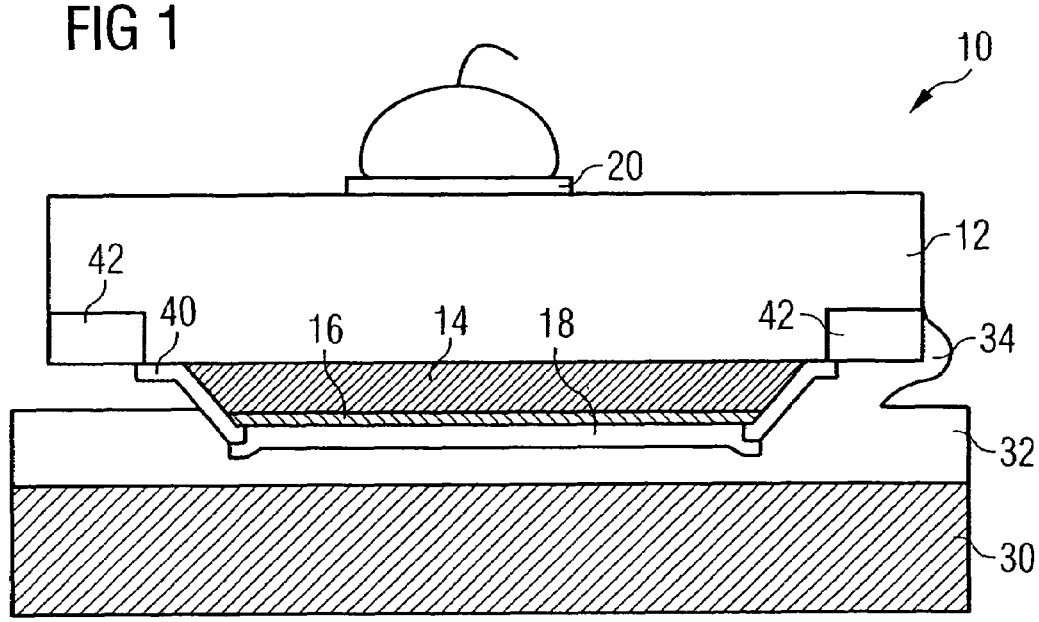
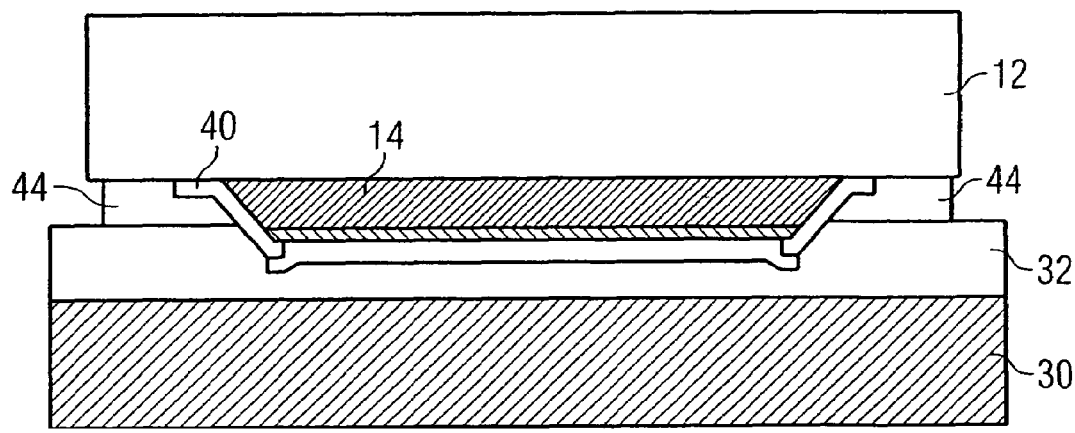

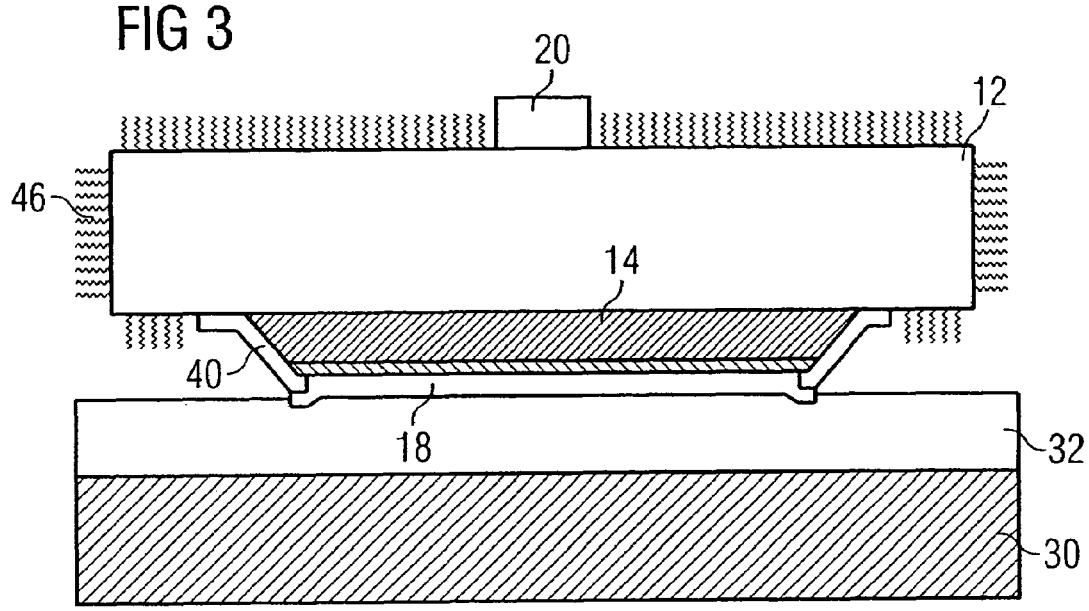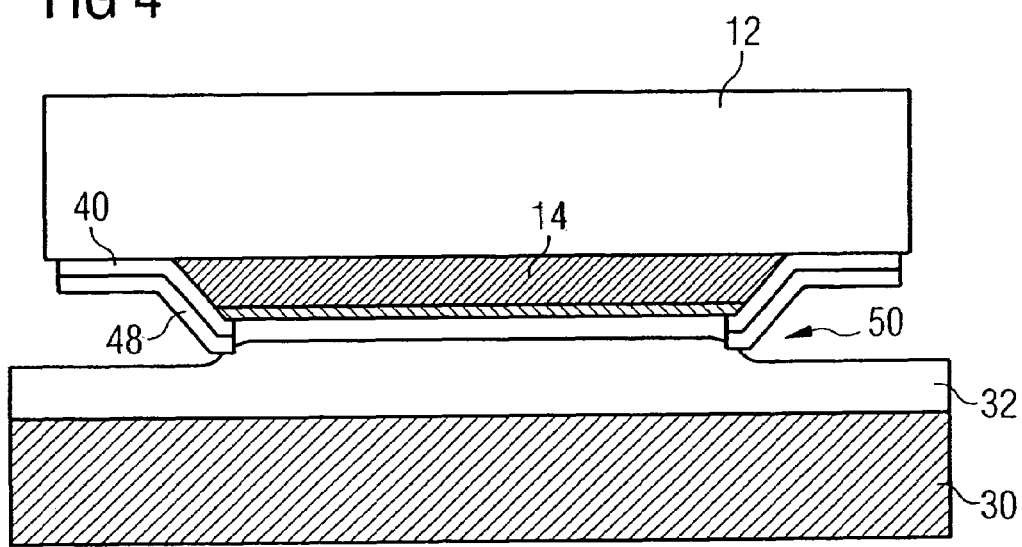

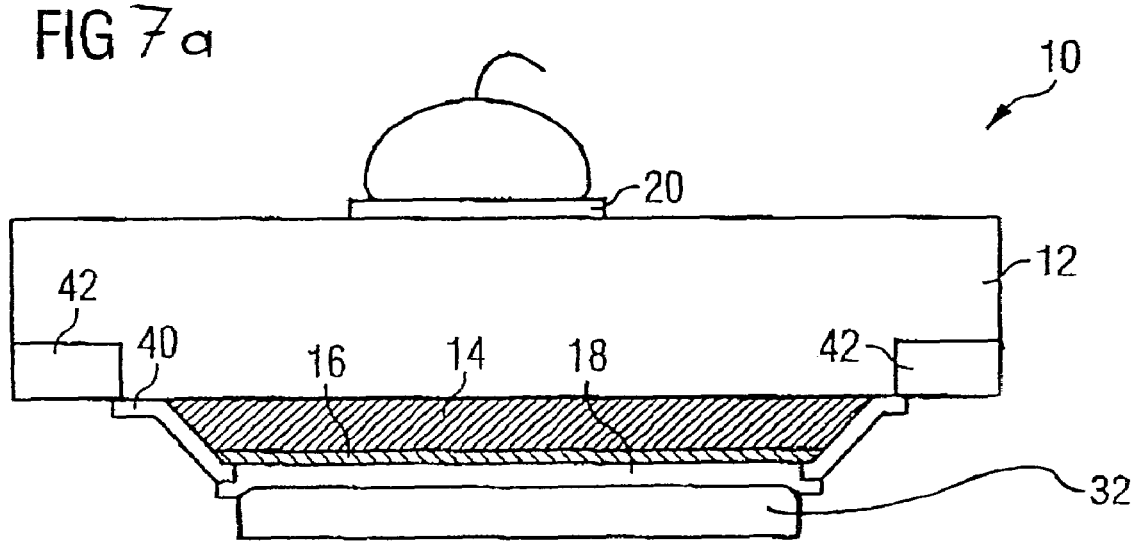

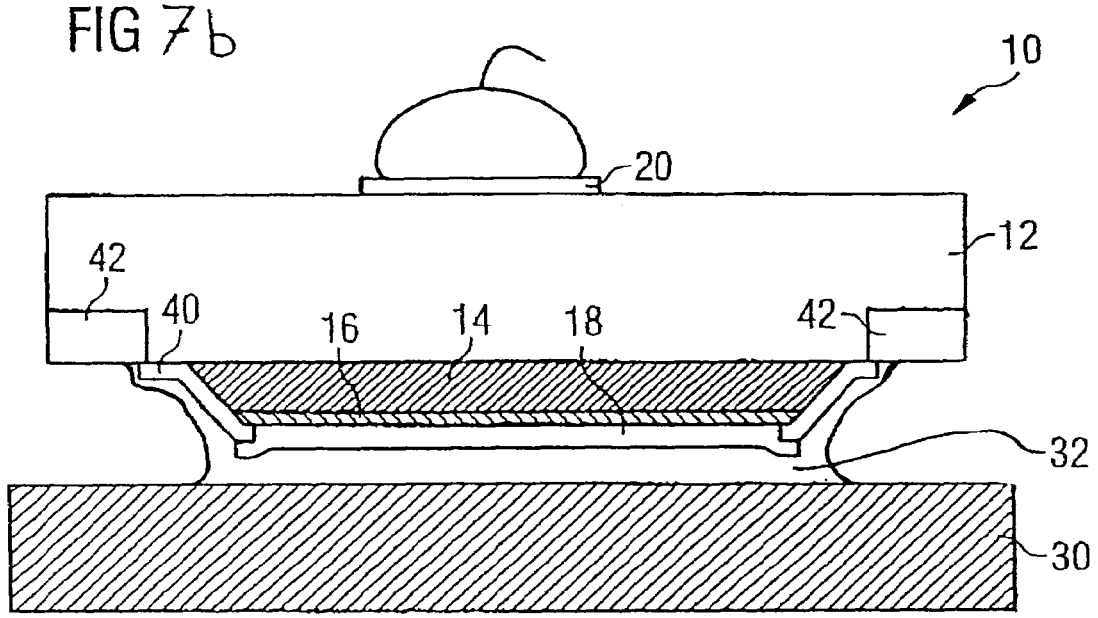

LUMINESCENT DIODE CHIP THAT IS FLIP-CHIP MOUNTED ON A CARRIER, AND METHOD FOR PRODUCTION THEREOF

CROSS-REFERENCE TO RELATED APPLICATIONS

This is a Divisional of U.S. Ser. No. 10/401,825, flied Mar. 28, 2003, now U.S. Pat. No. 6,927,425, which claims priority to German application no. 102 142 10.6 filed Mar. 28, 2002.

FIELD OF THE INVENTION

The invention relates to luminescent diode chips (hereinafter "LDCs") for flip-chip mounting on a solder-covered carrier, having a conductive substrate, a semiconductor body that contains a photon-emitting active zone and that is joined by an underside to the substrate, and a contact, disposed on a top side of the semiconductor body, for making an electrically conductive connection with a carrier upon the flip-chip mounting of the chip. The invention also relates to a method for producing a LDC of this kind.

BACKGROUND OF THE INVENTION

LDCs of the kind described above have a semiconductor body based on gallium nitride (GaN) that is disposed on a silicon carbide (SiC). Such luminescent diodes are fundamentally known, for instance from the book "The Blue Laser Diode" by Shuji Nakamura and Gerhard Fasol, published by Springer Verlag, Berlin and Heidelberg, 1997.

Upon a flip-chip mounting, the LDCs are mounted on a carrier, in particular a submount or leadframe of a package, for instance by means of soldering. This has the advantage of very good transfer of current and heat by way of the metal solder. Moreover, the solder can be applied over a large area, so that the transport of current and heat can take place essentially over the entire layer surface. Thus, particularly in high-power components, mounting LDCs by soldering is fundamentally preferable to other methods, such as adhesive bonding or mounting by way of microscopic bumps and the like.

However, in flip-chip mounting of the LDC by means of liquid solder melts, the problem arises that solder adheres not only as intended to the contacts of the LDC. Instead, a direct contact from the solder to the substrate often results. Since the SiC substrate is doped and conductive, this creates a parasitic contact by way of which current flows past the active luminescent layer in the semiconductor body. Such shunt connections lead to belated onset of the generation of light in the luminescent diode; that is, for the same operating current, the diode is darker than a flaw-free diode without shunt connections. If the shunt connection is very pronounced, in an extreme case it can even lead to complete failure of the component.

If GaN luminescent diodes on SiC substrates are placed on a submount covered with a thin solder layer and heated jointly with it without additional pressure, then for a typical lateral length of the LDC of approximately 250 μm, a typical height of the GaN semiconductor body of approximately 3 μm, and a typical thickness of the solder of approximately 1 to 2 μm, a contact between the SiC substrate and the solder from slight tilting of the LDC or as a result of unevenness can be avoided only with difficulty. In this method, the yield of properly functioning luminescent diodes is unacceptably low.

Although this problem can be circumvented by using non-conductive substrates, such as sapphire substrates, those substrates have still other disadvantages.

One way of dealing with this problem in conductive substrates and achieving an acceptable yield is to draw a dielectric passivation over the side edges of the semiconductor body. As a result of the dielectric passivation, the chip edges and a large part of the substrate surface can be protected.

However, this kind of passivation is applied before the LDCs are cut apart from the wafer composite. To prevent the brittle passivation material from flaking off when the chips are cut apart, the passivation must end at a certain distance from the edge of the chip, so that the chip edges themselves, once the chips have been cut apart, are unprotected. The side faces of the substrate in this method cannot be protected either. To achieve the aforementioned acceptable yield, close tolerance limits for the solder thickness and surface quality of the carrier must therefore be adhered to.

A further problem of luminescent diodes is that these components, compared with other semiconductor components that are flip-chip mounted, such as semiconductor lasers, have relatively small dimensions. The active face occupies a large proportion of the entire chip surface, thus leaving only little available space for any possible corrective measures. Moreover, the luminescent diodes in question here are mass-produced products, which are meant to be produced at low effort and expense.

SUMMARY OF THE INVENTION

One object of the invention is to improve a LDC of the type described above in such a way that the tolerances in flip-chip mounting onto a carrier are expanded. In particular, flip-chip mounting of the LDCs should be made possible without the creation of parasitic current paths between the solder and the substrate.

This and other objects are attained in accordance with one aspect of the invention directed to a luminescent diode chip for flip-chip mounting on a solder-covered carrier, comprising a conductive substrate, a semiconductor body, which includes a photon-emitting active zone having two opposite sides, one of which is joined to the substrate, and a contact, disposed on the other of the two sides of the semiconductor body, to form an electrically conductive connection with the solder-covered carrier upon the flip-chip mounting of the chip. Insulating means on the chip electrically insulates from the solder-covered carrier free faces of the semiconductor body and free surfaces of the conductive substrate that would be exposed to solder.

Another aspect of the invention is directed to a method for producing a luminescent diode chip for flip-chip mounting on a solder-covered carrier. A conductive substrate is provided with a semiconductor body that contains a photon-emitting active zone. One of two opposite sides of the semiconductor body is joined to the substrate, and a contact is provided on the other of the two sides for producing an electrically conductive connection with the solder-covered carrier upon the flip-chip mounting of the chip. An insulating means is formed on the chip, for electrically insulating from the solder-covered carrier free faces of the semiconductor body and free surfaces of the conductive substrate that would be exposed to solder.

Yet another aspect of the invention is directed to a luminescent diode chip for flip-chip mounting on a carrier, comprising a conductive substrate, a semiconductor body, which includes a photon-emitting active zone having two opposite sides, one of which is joined to the substrate, and a contact, disposed on the other of the two sides of the semiconductor body, to form an electrically conductive connection with the carrier upon the flip-chip mounting of the chip. A layer of solder is formed on the contact. Insulating means on the chip electrically insulates from the solder layer free faces of the semiconductor body and free surfaces of the conductive substrate that would be exposed to solder.

Still one other aspect of the invention is directed to a method for producing a luminescent diode chip for flip-chip mounting on a carrier. A conductive substrate is provided with a semiconductor body that contains a photon-emitting active zone. One of two opposite sides of the semiconductor body is joined to the substrate, and a contact is provided on the other of the two sides for producing an electrically conductive connection with the carrier upon the flip-chip mounting of the chip. An insulating means is formed on the chip, for electrically insulating from the solder layer free faces of the semiconductor body and free surfaces of the conductive substrate that would be exposed to solder.

According to the invention, in a LDC of this generic type, an insulating means is provided on the chip that serves to insulate free faces of the semiconductor body and substrate electrically from the carrier upon the flip-chip mounting of the chip.

In one LDC for flip-chip assembly, a solder-covered carrier is provided.

In another LDC for flip-chip assembly, the contact is covered with a layer of solder.

It is preferably provided that the insulating means includes a passivation layer that covers the free faces of the semiconductor body.

In particular in this connection, it is expedient if the insulating means includes a passivation layer that covers part of the free surface of the conductive substrate. The dielectric passivation for instance comprises silicon oxide or silicon nitride.

In a preferred feature of the LDC of the invention, it is provided that the insulating means further includes a near-surface subregion of the substrate, in which the electrical conductivity of the substrate is reduced.

In an advantageous feature, the electrical conductivity of the near-surface sub-region of the substrate is reduced by ion implantation. The penetration depth of high-energy ions can amount to several micrometers, so that not only the substrate surface but the substrate edges are to a certain extent electrically insulated and thus protected against the formation of parasitic current paths. The ion implantation can be done even before the LDCs in the wafer composite are cut apart into individual chips. In that case, because of the penetration depth of the ions, the side faces are still protected over a distance corresponding to the penetration depth even after the chips have been cut apart.

This procedure is especially well suited to SiC substrates, since because of the small atomic numbers of the constituent materials, that is, silicon and carbon, wide implantation ranges can be attained. On the other hand, the contact layer applied to the semiconductor body as a rule comprises a metal with a high atomic number, such as gold. Since the ions in this contact layer thus have only a slight penetration depth, the contact layer can at the same time be used as an implantation mask, making for a simple, uncomplicated step of the process.

An implantation with hydrogen ions is particularly preferred, because of their great range and the attendant effective insulation, including of the side edges of the substrate. An implantation with oxygen ions is also preferred, since oxygen together with silicon forms silicon dioxide, which is an excellent insulator.

Alternatively, in the present context, the electrical conductivity of the near-surface sub-regions of the substrate can be reduced by diffusion of oxygen in an oxidation process. Since this kind of oxygen diffusion step requires comparatively high temperatures, however, this step is expediently performed before the application of low-melting metal layers.

In another preferred feature, the insulating means further includes an insulating filling layer, applied to the passivation layer and to the substrate, serves to fill up the interstice between the substrate and the carrier upon the flip-chip mounting of the chip.

The insulating filling layer is advantageously applied before the LDCs are cut out from the wafer composite. In particular, the insulating filling layer can expediently be applied by centrifugal deposition and planarizing of an elastic polymer that fills up the trenches between the individual semiconductor mesas. Since the polymer is elastic, it can be cut apart along with the chips without breakage. After the planarization step, the polymer has the same height as the semiconductor body, such as 3 µm, so that the polymer filling layer, after mounting on the carrier, prevents the substrate edges from sinking into the solder.

In an especially preferred feature, polyimide is used as the elastic polymer, since polyimide can withstand soldering temperatures of 300° C. or more without decomposing.

In another preferred feature of the invention, the insulating means includes, besides the passivation layer, a thin layer of insulating molecules that coats essentially the entire free surface of the substrate.

The insulating molecular layer in this context advantageously includes molecules with two functional groups, one of which adheres to the substrate and the other shields the surface.

A preferred example of this kind of molecule class with two functional groups is alkylchlorosilanes, whose Si—Cl bond is highly reactive and readily combines with the Si atoms of a silicon carbide substrate, while the alkyl group prevents the wetting of the surface.

Furthermore, the alkylchlorosilanes can be made temperature-stable, in a particularly preferred feature of the invention, by fluorination.

In a preferred feature, the application of the insulating molecular layer is done by dipping already cut-apart LDCs into a solution of the molecule, so that essentially the entire substrate can be protected. Coating of metal contacts can either be avoided by means of the chemical selectivity of the molecules, or a coating that may occur is destroyed again and removed as the solder is melted on.

The insulating molecular layer is expediently made only one or only a few molecule layers thick, so that the optical transparency of the substrate is left practically unchanged.

In still another preferred feature of the invention, the insulating molecular layer has a special anti-wetting layer that is not wetted by the molten solder of the carrier. The anti-wetting layer prevents the LDC from dipping too deeply into the liquid solder, since if the chip tilts, the contact between the anti-wetting layer and the solder engenders a force driving it backward, which rights the chip again. As a result, the chip "floats" on the solder, and the likelihood of a parasitic current contact is sharply reduced.

The anti-wetting layer can be applied to the aforementioned first passivation layer. However, it can itself act as an electrical passivation layer as well, and in that case an additional passivation layer can be dispensed with.

In addition to the measures for electrical insulation mentioned, it can be expedient if between the individual LDCs, before they are cut apart from the wafer composite, dividing trenches are made along which the individual LDCs are separated. Then the insulating means is preferably applied in such a way that it extends into the dividing trenches. As a result, the spacing of unprotected parts of the substrate from the solder is increased. The structuring of dividing trenches can be done by any known method, such as dry etching, sawing, or laser ablation.

In the LDC of the invention, the substrate preferably substantially comprises SiC.

The invention is applicable to luminescent diodes with semiconductor bodies of all material systems, in particular semiconductor bodies on the basis of GaP, GaAsP, GaAs, GaAlAs, InGaAsP, GaN, or InGaN.

Further advantageous features, characteristics and details of the invention will become apparent from the dependent claims, the description of the exemplary embodiments, and the drawings.

BRIEF DESCRIPTION OF THE DRAWINGS

FIG. 1, a schematic sectional view through a LDC in one exemplary embodiment of the invention, mounted on a solder-covered carrier;

FIG. 2, a schematic sectional view of a LDC, mounted on a solder-covered carrier, in another exemplary embodiment of the invention;

FIG. 3, a schematic sectional view of a LDC, mounted on a solder-covered carrier, in a further exemplary embodiment of the invention;

FIG. 4, a schematic sectional view of a LDC, mounted on a solder-covered carrier, in a further exemplary embodiment of the invention;

FIG. 7a, a schematic sectional view through a LDC similar to the one shown in FIG. 1, except that a solder layer is provided on the contact, and the carrier is not solder-covered;

FIG. 7b, a schematic sectional view of a LDC with the chip of FIG. 7a.

DETAILED DESCRIPTION OF THE DRAWINGS

Figure 5A:
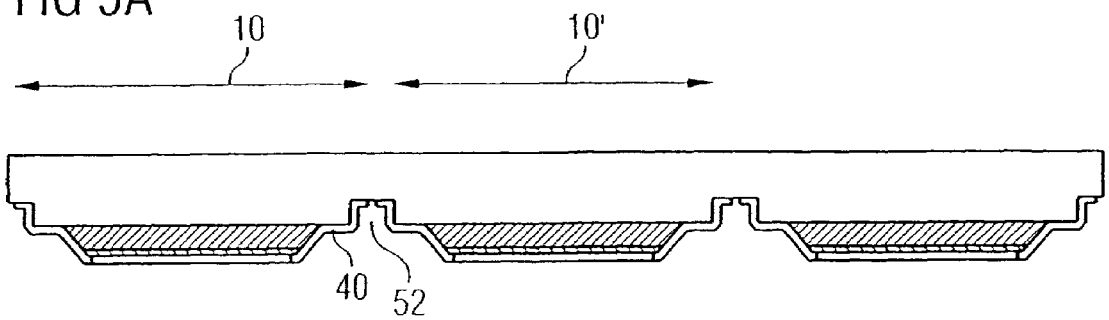
FIG. 5a, a schematic sectional view through a plurality of LDCs in one exemplary embodiment of the invention, before they are cut apart from the wafer composite.

FIG. 1 shows a schematic sectional view through a LDC, generally identified by reference numeral 10, of one exemplary embodiment of the invention. The LDC 10 includes a transparent, conductive SiC substrate 12, on which a GaN-based radiation-generating semiconductor body 14 has been grown. The structure of this kind of radiation-generating semiconductor body 14 is known per se and is not essential to the invention, so it will not be described in further detail.

A highly reflective mirror layer 16 and a contact metal layer 18, such as one made of gold, are applied to the surface of the semiconductor body 14 remote from the substrate 12. Current is impressed into the radiation-generating layer of the semiconductor body 14 on one side via a back-side contact 20 and on the other via a solder-covered carrier 30, 32, on which the LDC 10 is mounted by flip-chip mounting.

To prevent parasitic contacts from occurring between the metal solder 32 and the substrate 12, which reduce the proportion of the current flowing through the radiation-generating layer, two insulating provisions are taken in the exemplary embodiment of FIG. 1. First, a dielectric passivation layer 40 is applied to the free side edges of the semiconductor body 14 and to a majority of the surface of the substrate 12 (the illustration in FIG. 1 is not to scale). However, the passivation 40, if it is to be prevented from flaking off when the chips are cut apart from the wafer composite, must end some distance away from the edge of the chip. In that region, in this exemplary embodiment, a hydrogen ion implantation is performed as a second provision. This increases the electrical resistance of the substrate in a region 42 surrounding the semiconductor body 14 significantly. The contact layer 18 can serve as an implantation mask.

Because of the great penetration depth of the hydrogen ions in the SiC substrate, the high-impedance region 42, after the chips have been cut apart, extends some micrometers along the side faces of the substrate. As a result, even moderate wetting of the side faces of the chip by the solder, which is represented by reference numeral 34 on the right-hand side of FIG. 1, remains harmless to the LDC.

Another exemplary embodiment is shown in FIG. 2. Identical elements are identified by the same reference numerals as in FIG. 1 and will not be described again separately. In the exemplary embodiment of FIG. 2, after the application of the passivation layer 40, a polyimide layer 44 is applied to the LDC of the wafer composite and planarized, so that the polyimide layer 44 fills the interstices between mesas of the GaN based semiconductor body 14 up to the upper edge of the mesas. Since the polyimide layer 44 is elastic, the LDCs with the polymer layer can be cut apart without breakage. After the flip-chip mounting of the LDC, the polyimide layer 44 then prevents the substrate edges from sinking into the solder 32.

FIG. 3 shows a further exemplary embodiment of the LDC of the invention. Once again, the same reference numerals identify the same elements as in FIG. 1. As in the exemplary embodiments above, in the exemplary embodiment of FIG. 3 a passivation layer 40 is applied in the wafer composite. After the chips have been cut apart, the LDCs have then been dipped into a solution of alkylchlorosilane, so as to form an insulating molecular layer 46 that coats essentially the entire substrate surface. The Si—Cl bond of the alkylchlorosilane leads to a binding of the molecules to the surface of the SiC substrate 12, and the alkyl group prevents wetting of the surface. Coating the contacts 18, 20 can either be avoided by means of the chemical selectivity of the molecules, or else such a coating is destroyed as the solder is melted on. Since the molecule layer is only one or only a few molecule layers thick, the optical transparency of the substrate 12 is unimpaired.

Alternatively, a short-chained fluoroalkyl connection can be used. Therein, both chain ends include a reactive chlorosilane group, such as $SiCl_3$—$(CHF)_n$—$SiCl_3$. When forming of the LDCs is performed in a water free environment, one end of the chain attaches itself to the semiconductor surface. After that, the LDCs are brought into a moist environment so that the SiCl groups that point outward connect to each other via Si—O—Si bridges and form a SiO surface that is not wetted by the solder.

A further exemplary embodiment of the invention is shown in FIG. 4. Here a special anti-wetting layer 48 is applied to the passivation layer 40. The anti-wetting layer 48 can, for instance, be a layer comprising the aforementioned alkylchlorosilanes, which have the property of not coming to be wetted by the molten solder 32. If the chip tilts, a larger contact area on the side of lesser spacing creates a force that drives it backward and rights the chip again. As a result, the chip can be said to float (reference numeral 50) on the solder 32.

Figure 5B:
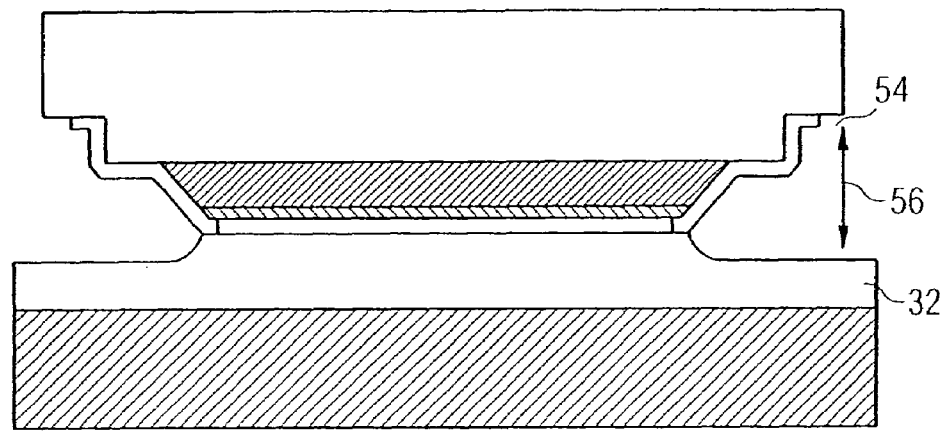
FIG. 5b, a LDC from the wafer composite of FIG. 5a after it has been cut apart, and flip-chip mounting on a solder-covered carrier.

If the spacing of the unprotected substrate edge from the solder layer 32 is to be increased still further for the sake of secure isolation, then dividing trenches 52 a few micrometers deep can additionally be structured on the wafer composite, before it is cut apart, between the LDCs 10, 10' (FIG. 5a). The electrical passivation 40, or the above-described implantation region 42, the filling layer 44, the insulating molecular layer 46, or the anti-wetting layer 48 is then drawn on into these trenches 52. As shown in FIG. 5b, after the LDCs have been cut apart, a recessed region 54 then remains on the edge of the chip, and this region has an increased distance 56 from the solder 32, thus reducing the likelihood of contact with the chip edge.

Figure 6:
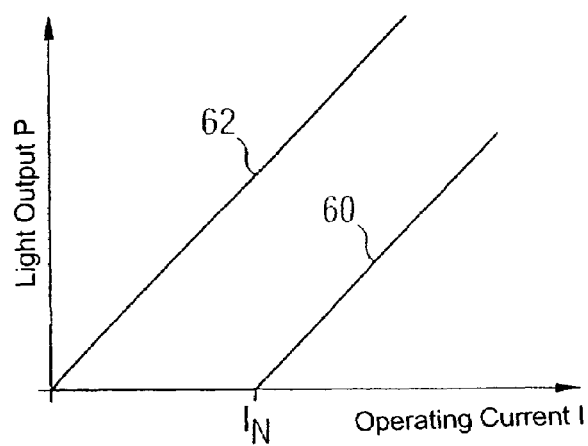
FIG. 6, a graph that compares the dependency of the light output on the operating current for a luminescent diode with shunt connections and a luminescent diode of the invention.

FIG. 6, to illustrate the effect of the invention, shows the dependency of the light output, plotted on the ordinate, as a function of the impressed operating current, plotted on the abscissa, for two luminescent diodes. The light curve 60 is the light curve of a luminescent diode with shunt connections, in which the light generation does not occur until belatedly, at an operating current $I_N$. Conversely, the light curve 62 of a luminescent diode of the invention without shunt connections exhibits a faster onset of light generation and a higher output power at every operating current than the luminescent diode that is burdened by shunt connections.

FIGS. 7a and 7b show another embodiment of the invention which is similar to the embodiment of FIG. 1. The main difference between the two embodiments is that FIGS. 7a and 7b do not utilize a solder-covered carrier. In fact, carrier 30 does not initially have any solder on it. Instead, the solder layer 32 is applied to contact 18. The remainder of the LDC and the method of fabricating it is essentially the same.

In all exemplary embodiments, a layer of solder is or may be applied onto the contact and such a LDC can be assembled onto a solder-free carrier.

We claim:

1. A luminescent diode chip for flip-chip mounting on a carrier which is covered by solder, comprising:
    a conductive substrate;
    a semiconductor body comprising a photon-emitting active zone and two opposite sides, one of the two sides being joined to said conductive substrate;
    a contact, disposed on the other of said two sides of said semiconductor body, to form an electrically conductive connection with the carrier upon the flip-chip mounting of the chip;
    a solder layer formed on said contact; and
    insulating means on the chip for electrically insulating the solder layer from free faces of said semiconductor body and free surfaces of said conductive substrate that would be exposed to said solder layer,
    wherein said insulating means includes a passivation layer that covers said free faces of said semiconductor body, and
    wherein said insulating means further includes an insulating filling layer, applied to said passivation layer and to said substrate, for filling up the interstice between said substrate and the carrier upon the flip-chip mounting of the chip.

2. The luminescent diode chip of claim 1, wherein said passivation layer also covers part of the free surfaces of said substrate.

3. The luminescent diode chip of claim 1, wherein the electrical conductivity of said near-surface sub-region of said substrate is reduced by ion implantation.

4. The luminescent diode chip of claim 3, wherein the electrical conductivity is reduced by ion implantation with hydrogen or oxygen ions.

5. The luminescent diode chip of claim 1, wherein the electrical conductivity of said near-surface sub-region of said substrate is reduced by diffusion of oxygen.

6. The luminescent diode chip of claim 1, wherein said insulating filling layer includes an elastic polymer.

7. The luminescent diode chip of claim 1, wherein said insulating filling layer includes polyimide.

8. The luminescent diode chip of claim 1, wherein said insulating filling layer is planarized, in order to be at the same height as the other side of said semiconductor body.

9. A luminescent diode chip for flip-chip mounting on a carrier which is covered by solder, comprising:
    a conductive substrate;
    a semiconductor body comprising a photon-emitting active zone and two opposite sides, one of the two sides being joined to said conductive substrate;
    a contact, disposed on the other of said two sides of said semiconductor body, to form an electrically conductive connection with the carrier upon the flip-chip mounting of the chip; and
    insulating means on the chip for electrically insulating the carrier from free faces of the semiconductor body and free surfaces of the substrate that would be exposed to the solder,
    wherein said insulating means includes a passivation layer that covers said free faces of said semiconductor body, and
    wherein said insulating means further includes a thin, insulating molecular layer, which coats essentially the entire free surfaces of said substrate.

10. The luminescent diode chip of claim 9, wherein said insulating molecular layer includes molecules with two functional groups, one of which adheres to said substrate and the other of which shields said free surfaces.

11. The luminescent diode chip of claim 9, wherein said molecular layer includes alkylchlorosilanes.

12. The luminescent diode chip of claim 9, wherein said molecular layer is one molecular layer or a few molecular layers thick.

13. A luminescent diode chip for flip-chip mounting on a carrier, comprising:
    a conductive substrate;
    a semiconductor body comprising a photon-emitting active zone and two opposite sides, one of said two sides being joined to said conductive substrate;
    a contact, disposed on the other of said two sides of said semiconductor body, to form an electrically conductive connection with the carrier upon the flip-chip mounting of the chip;
    a solder layer formed on the contact; and
    insulating means on the chip for electrically insulating said solder layer from free faces of said semiconductor body and free surfaces of said conductive substrate that would be exposed to said solder layer,
    wherein said insulating means includes a passivation layer that covers said free faces of said semiconductor body, and
    wherein said insulating means further includes an insulating filling layer, applied to said passivation layer and to said conductive substrate, for filling up the interstice between said substrate and the carrier upon the flip-chip mounting of the chip.

14. The luminescent diode chip of claim 13, wherein the electrical conductivity of said near-surface sub-region of said substrate is reduced by ion implantation.

15. The luminescent diode chip of claim 13, wherein the electrical conductivity is reduced by ion implantation with hydrogen or oxygen ions.

16. The luminescent diode chip of claim 13, wherein the electrical conductivity of said near-surface sub-region of said substrate is reduced by diffusion of oxygen.

17. The luminescent diode chip of claim 13, wherein said insulating filling layer includes an elastic polymer.

18. The luminescent diode chip of claim 13, wherein said insulating filling layer includes polyimide.

19. The luminescent diode chip of claim 13, wherein said insulating filling layer is planarized, in order to be at the same height as the other side of said semiconductor body.

20. A luminescent diode chip for flip-chip mounting on a carrier, comprising:
a conductive substrate;
a semiconductor body comprising a photon-emitting active zone and two opposite sides, one of the two sides being joined to said conductive substrate;
a contact, disposed on the other of said two sides of said semiconductor body, to form an electrically conductive connection with the carrier upon the flip-chip mounting of the chip;
a solder layer formed on said contact; and
insulating means on the chip for electrically insulating said solder layer from free faces of said semiconductor body and free surfaces of said conductive substrate that would be exposed to said solder layer,
wherein said insulating means includes a passivation layer that covers said free faces of said semiconductor body, and
wherein said insulating means further includes, a thin, insulating molecular layer, which coats essentially the entire free surfaces of said substrate.

21. The luminescent diode chip of claim 20, wherein said insulating molecular layer includes molecules with two functional groups, one of which adheres to said substrate and the other of which shields said free surfaces.

22. The luminescent diode chip of claim 20, wherein said molecular layer includes alkylchlorosilanes.

23. The luminescent diode chip of claim 20, wherein said molecular layer is one molecular layer or a few molecular layers thick.

24. The luminescent diode chip of claim 22, wherein said alkylchlorosilanes are fluorinated alkylchlorosilanes.

25. The luminescent diode chip of claim 11, wherein said alkylchlorosilanes are fluorinated alkylchlorosilanes.

26. The luminescent diode chip of claim 9, wherein said passivation layer covers part of the free surfaces of said substrate.

27. The luminescent diode chip of claim 13, wherein said passivation layer covers part of the free surfaces of said substrate.

* * * * *